Feb. 26, 1974 W. M. MUSKA 3,794,536

DIELECTRIC CIRCUIT FORMING PROCESS

Filed Jan. 31, 1972 2 Sheets-Sheet 1

United States Patent Office 3,794,536
Patented Feb. 26, 1974

3,794,536
DIELECTRIC CIRCUIT FORMING PROCESS

Willis Martin Muska, Sea Bright, N.J., assignor to Bell Telephone Laboratories, Incorporated, Murray Hill and Berkeley Heights, N.J.

Filed Jan. 31, 1972, Ser. No. 222,010
Int. Cl. B29c *17/08;* H01l *7/50*
U.S. Cl. 156—11 1 Claim

ABSTRACT OF THE DISCLOSURE

There is disclosed a process for forming integrated optical circuit components on a substrate wafer in the form of dielectric thin films in patterns of high resolution and edge smoothness. For high resolution, the use of electron-resist and electron-beam exposure techniques is described. Particularly disclosed is the use of a manganese mask formed over the circuit layer, the exposed portions of which are sputter etched away.

BACKGROUND OF THE INVENTION

This invention relates to the fabrication of integrated circuits, particularly those using metallic masking techniques.

It has been found in the field of optical information processing and proposed optical communication systems that integrated circuit techniques employing thin transparent lightguiding films are feasible if the circuit is made with sufficiently high resolution and edge smoothness.

Edge smoothness is perhaps the most important consideration in the implementation of such high resolution integrated circuits, particularly when the thin film is to be formed into a circuit including strip lightguides. Even in other types of integrated circuits requiring such high resolution, edge smoothness of each conductive or waveguiding strip is important because of the small dimensions involved.

In the optical lightguiding field, it has been found that strip guides of transverse dimensions of the order of a wavelength can be achieved with sufficient resolution by use of electron-resist techniques and electron-beam exposure.

It has been found that a metallic masking technique employing aluminum is also desirable in forming such high resolution circuits. This aluminum masking technique is disclosed in the copending patent application of J. E. Goell, Ser. No. 187,807, filed Oct. 8, 1971, now Pat. No. 3,748,246 and assigned to the assignee hereof, to have the property of facilitating improved edge smoothness in the finished product when used in cooperation with electron-resist techniques.

SUMMARY OF THE INVENTION

I have discovered that manganese can be advantageously substituted for aluminum in the masking technique of the above-cited patent application of J. E. Goell.

While I do not wish to limit my invention to any particular aspect of, or theory regarding its advantages, it appears that at least part of the processing advantages attributable to the use of manganese accrue from the fact that it is readily evaporated during the deposition step and has a smoother edge after sputter etching.

Superior high resolution circuitry at lower processing cost is presently indicated. In fact, the use of manganese masking is attractive for some semiconductor integrated circuit processing.

BRIEF DESCRIPTION OF THE DRAWING

Further features and advantages of my invention will become apparent from the following detailed description, taken together with the drawing, in which.

DESCRIPTION OF ILLUSTRATIVE EMBODIMENT

Figure 1:
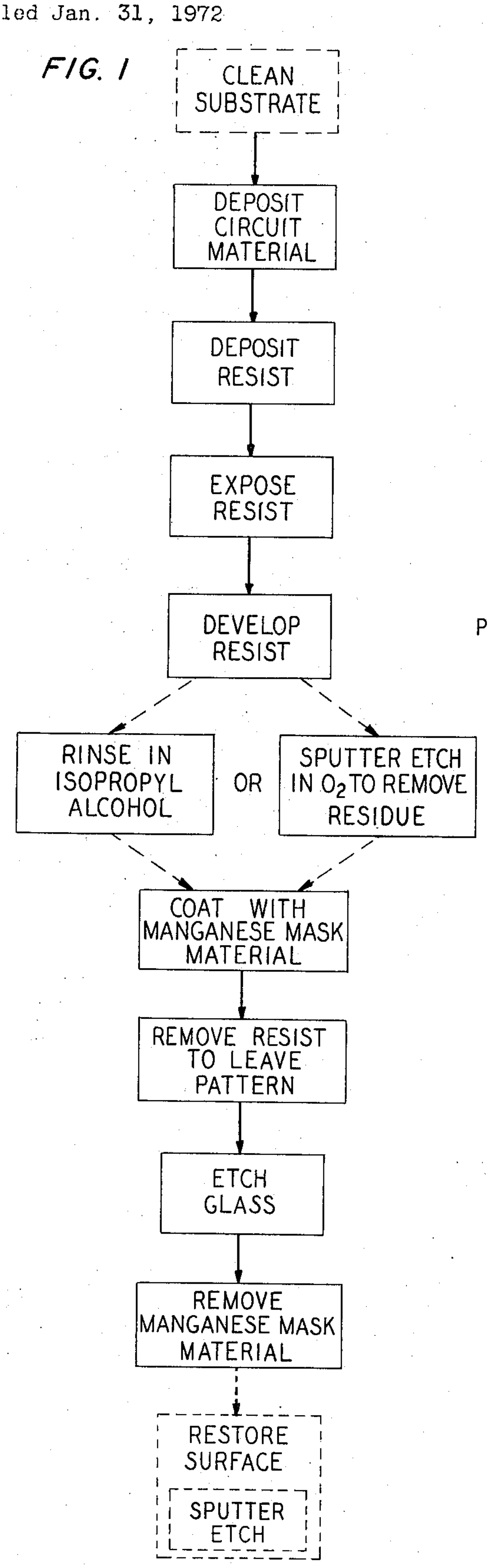
FIG. 1 is a block diagrammatic flow chart of an illustrative process according to my invention.

The process of FIG. 1 starts with a substrate which has been cleaned, as shown in the optional step indicated in the dotted box. Illustratively, the substrate is a high-quality low-loss relatively low-index glass such as is provided by a microscope slide. Cleaning techniques are standard in the art. Next, the substrate, for instance the substrate 11 of FIG. 2A, has deposited by RF sputtering thereon a circuit material 12 which is an approximately 0.3-micrometer-thick film of a glass, such as the 7059 glass, available from Corning Corporation. In the next step of the process an electron-resist is deposited in a continuous film 13 over the circuit material 12, as indicated in the third step of the process of FIG. 1. Illustratively, this result is achieved by spin coating a roughly one and one-half-micrometer-thick film of poly-(methylmethacrylate) (PMMA) onto the circuit material.

In the fourth step of the process of FIG. 1, the electron-resist 13 is then exposed by an electron-beam which is deflected to produce the desired pattern with the desired resolution. Thereafter, the electron-resist is developed. The development of the electron-resist removes the exposed portion thereof as indicated by the gap in the layer 13 in FIG. 2B. Still further, this step is carried to its logical conclusion to insure that all resist is removed from the top of circuit material 12 in the developed area by rinsing the central portion of the assembly in isopropyl alcohol to remove the residue of the PMMA which randomly adheres to the top surface of circuit material 12. This rinse does not substantially affect the remainder of the resist 13.

Figures 2A, 2B, 2C, 2D, 2E, 2F:
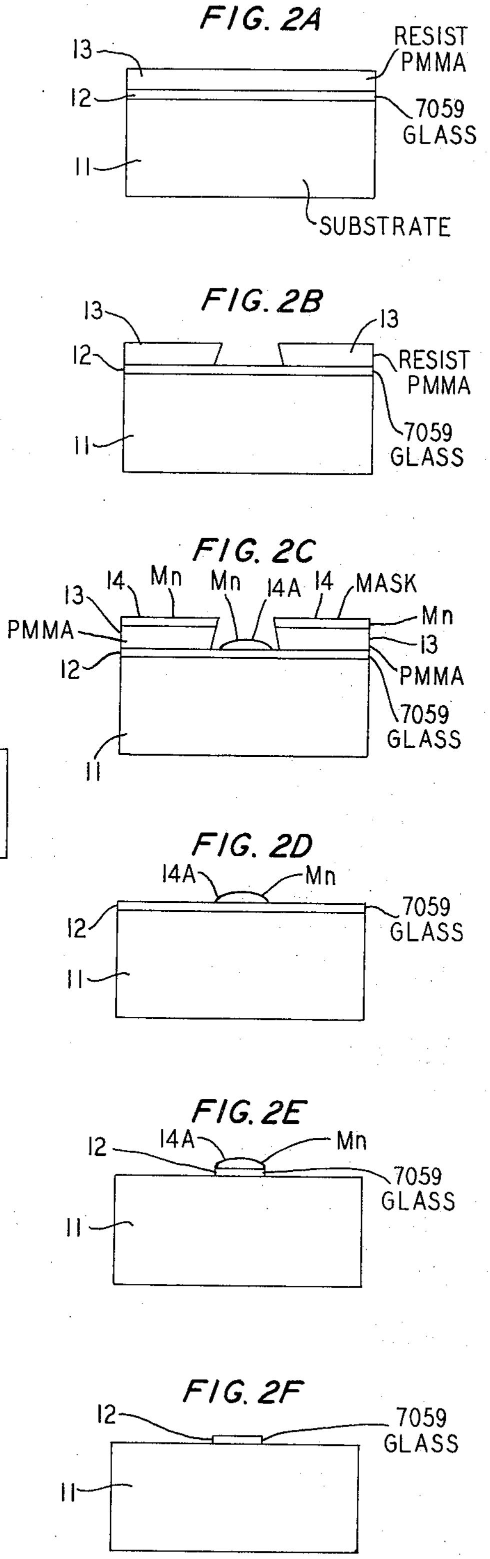
FIGS. 2A through 2F show intermediate through final products of the process of FIG. 1 in pictorial form for certain key steps of the process of FIG. 1.

Alternatively, as indicated by the optional branching of the process of FIG. 1, at this point the residual exposed and developed resist in the gap of FIG. 2B can be removed by sputter etching the surface of the exposed glass circuit material 12 in oxygen to remove the residue.

The next step of the process of FIG. 1 is relatively significant. A roughly 2500 angstrom-unit-thick coating 14 of manganese is deposited by evaporation on the remaining electron-resist 13 and on the exposed portion of the circuit material 12. Next, the remaining PMMA electron-resist 13 is dissolved with acetone so that both it and the remaining manganese mask material above it are removed. That portion of the manganese mask material is removed because it no longer has a surface to adhere to. The remainder of manganese coating, which is mask 14A, is unaffected by the acetone. The removal of the remaining resist leaves the mask 14A in the form of the desired circuit pattern, on top of the circuit material 12, as shown in FIG. 2D.

To reproduce the same pattern in the circuit material 12, the portion thereof not masked by mask 14A is sputter etched away to produce the intermediate product of FIG. 2E.

In the next-to-last-step of the process of FIG. 1, the remaining manganese is removed with a chemical etchant such as hydrochloric acid. The circuit illustratively has the cross section shown in the final product illustration of FIG. 2F. Since top surface damage increases optical loss, my process provides an optional step that can restore the surface of the waveguiding circuit 12 as indicated in the last step of the process of FIG. 1. This surface restoration is accomplished by briefly sputter etching it to remove any damage to it caused by the deposition and chemical removal of the manganese mask 14A.

The following detailed data for one specific processing example resulted in a superior lightguide circuit. A 1.5 micrometer thickness of the PMMA electron-resist 13 was deposited over the glass 12. The resist was exposed with a beam current of about $6\times10^{-6}$ amperes/cm.$^2$ at a beam voltage of about 20 kilovolts. The exposure time was 20 seconds. The electron-resist was developed for about 1 minute and 15 seconds.

Next, manganese was coated onto the product of the previous step by vacuum evaporation until a coating thickness of about 2100 angstrom units was achieved. The evaporation source was a molybdenum dimple boat. The distance between source and substrate was 10 inches, and the temperature of the boat was such that approximately 5 minutes exposure time was required to deposit 2000 angstrom units of manganese.

In other respects, the processing steps are the same as described in the above-cited copending patent application of J. E. Goell.

I thereafter varied the sputtering parameters to discover the combination that resulted in the highest resolution circuitry. I concluded that the optimal manganese film thickness was about 2000 angstrom units, given the other materials described above. The other parameters are not critical so long as all of the developed resist is removed before the manganese deposition. Typical etching depths for a 150 milliampere plate current in a $1\times10^{-2}$ torr atmosphere of oxygen with 5-inch-diameter electrodes are as follows. For a sputtering time of 90 minutes the etching depth is 3100 angstrom units. For a sputtering time of 120 minutes the etching depth is 4200 angstrom units. The typical etchant used to remove the manganese mask was a 10 percent hydrochloric acid solution. The finishing sputter etching step was accomplished in an argon atmosphere for a time period of about 10 minutes.

It was found that the root mean square edge deviation in the finished circuit was substantially less than 500 angstrom units and thus substantially less than that achieved in the above-stated patent application of J. E. Goell.

While my present invention appears to be particularly desirable for optical integrated circuit processing of the type employing thin film lightguides, the ease of sputter coating of the manganese material also makes it attractive for use in other semiconductor integrated circuit processing.

Figure 3:
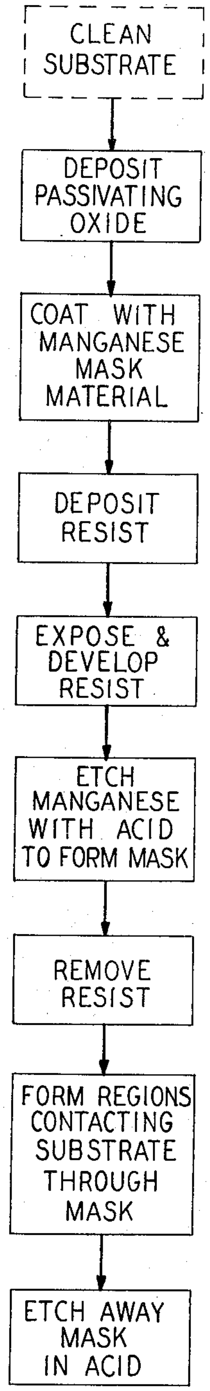
FIG. 3 is a block diagram flow chart of a modified process according to my invention for use in semiconductor integrated circuit processing.

A modified process for semiconductor integrated circuits is shown in FIG. 3. The substrate 30 would illustratively be a silicon substrate and the passivating oxide 31 would illustratively be silicon dioxide. The deposition or generation of such a passivating oxide layer is done by techniques well known in the art.

Figure 4A:
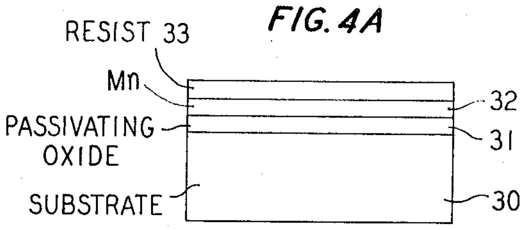
FIGS. 4A through 4E show intermediate to final products of the process of FIG. 3 in pictorial form for certain key steps of the process of FIG. 3.
Figure 4B:
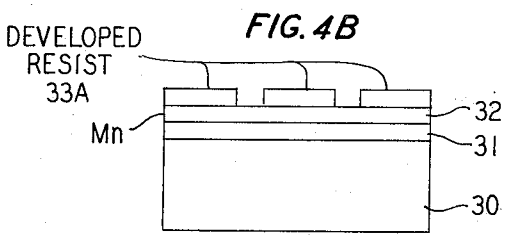

In contrast to the process of FIG. 1, the manganese masking material 32 is deposited on the passivating oxide layer 31 before the deposition of the electron-resist 33, to produce the intermediate product of FIG. 4A. The electron-resist 33 may illustratively still be PMMA. The electron-resist is now exposed and developed as described above so that portions of the manganese layer 32 that are to be removed are accessible to the etchant of the etching step, and shown in FIG. 4B. These portions of the manganese layer 32 are etched away by a hydrochloric acid solution to form the mask 32A of FIG. 4C.

Figure 4C:
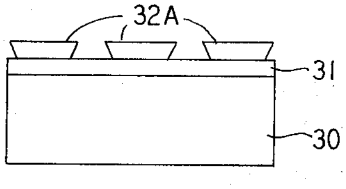

The product of FIG. 4C is now sputter etched by cathode sputtering. Most of the exposed portions of oxide layer 31 are removed; but mask 32A remains substantially intact.

Figure 4D:
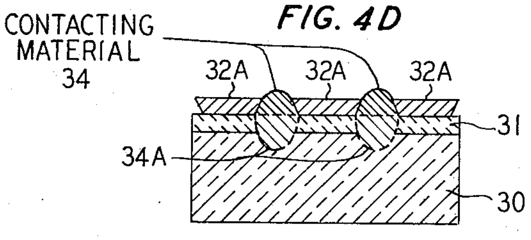

In the next step it is desired to deposit through the mask 32A some type of material 34 to contact the underlying substrate 30 through the passivating oxide 31. While the contacting material 34 could be a second type of semiconductive material deposited to form junctions with substrate 30, we may assume for purposes of illustration that material 34 consists of a platinum-bearing composition, illustratively pure platinum sputtered in argon, at temperatures and electron energies well known in the integrated circuit art, e.g., P. A. Byrnes, Jr., Pat. No. 3,479,-269, column 6, lines 34–38, to form platinum silicide contacts 34A, as shown in FIG. 4D. The portions 34 above the level that can interact with silicon are pure platinum. The remaining manganese mask 32A is now removed in a ten percent hydrochloric acid bath, as described above for the manganese chemical etching step.

Figure 4E:
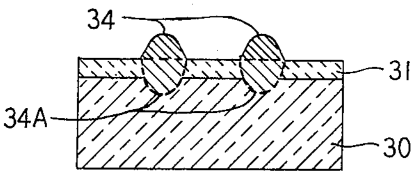

The finished circuit of FIG. 4E includes two ohmic contacts 34A to the substrate 30 which are useful in conjunction with nearby semiconductor junctions or barrier-layer rectifiers, either of which could be formed through manganese masks such as mask 32A, but which are not shown for ease of illustration. The particular circuit configuration has nothing to do with the present invention. The principle advantage of the present invention with respect to a device of the type described in FIG. 4E is the relatively small cross-sectional dimension of a contact area 34A that can be achieved while making a reliable ohmic contact or rectifying junction.

I claim:

1. A process for forming integrated optical circuit components on a transparent substrate wafer, comprising the steps of depositing a continuous layer of a transparent light-guiding material over said transparent substrate, said material having an index of refraction exceeding that of said transparent substrate,
depositing an electron-resist in a continuous layer over said layer of material,
exposing and developing said electron-resist in a selected circuit pattern to uncover portions of said layer of material,
evaporating manganese onto said resist and uncovered portions of said layer of material,
removing the remaining resist,
sputter etching away the exposed portions of said layer of material, and
chemically etching away the remaining manganese.

References Cited

UNITED STATES PATENTS

| | | | |
|---|---|---|---|
| 3,287,612 | 11/1966 | Lepselter | 317—235 |
| 3,585,121 | 6/1971 | Franks et al. | 204—192 |
| 3,698,947 | 10/1972 | Kemlage et al. | 117—212 |

WILLIAM A. POWELL, Primary Examiner

U.S. Cl. X.R.

156—17